United States Patent
Cull et al.

(10) Patent No.: US 7,489,962 B2
(45) Date of Patent: Feb. 10, 2009

(54) JUMPING AROUND THE CENTER OF K-SPACE IN ANNULAR SEQUENTIAL STEPS

(75) Inventors: Thomas S. Cull, Wickliffe, OH (US); Laura M. Gaul, Willoughby, OH (US); Sara M. Oberrecht, Garfield Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 36 days.

(21) Appl. No.: 10/572,777

(22) PCT Filed: Sep. 9, 2004

(86) PCT No.: PCT/IB2004/051728

§ 371 (c)(1), (2), (4) Date: Mar. 21, 2006

(87) PCT Pub. No.: WO2005/029112

PCT Pub. Date: Mar. 31, 2005

(65) Prior Publication Data

US 2007/0078331 A1  Apr. 5, 2007

Related U.S. Application Data

(60) Provisional application No. 60/505,334, filed on Sep. 23, 2003, provisional application No. 60/583,883, filed on Jun. 29, 2004.

(51) Int. Cl.
*A61B 5/05* (2006.01)
(52) U.S. Cl. ....................................... 600/410
(58) Field of Classification Search ................. 600/410, 600/413, 415; 324/307, 309
See application file for complete search history.

(56) References Cited

U.S. PATENT DOCUMENTS

| 5,122,747 | A  | 6/1992 | Riederer et al. ............. 324/309 |
| 5,912,557 | A  | 6/1999 | Wilman et al. ............. 324/309 |
| 6,198,959 | B1 | 3/2001 | Wang .......................... 600/413 |
| 6,201,986 | B1 | 3/2001 | Riederer et al. ............. 600/419 |
| 6,278,273 | B1 | 8/2001 | Riederer et al. ............. 324/309 |

(Continued)

OTHER PUBLICATIONS

Wilman, A.H., et al.; Fluoroscopically Triggered Contrast-enhanced Three-dimensional MR Angiography with Elliptical Centric View Order; 1997; Radiology; 205:137-146.

(Continued)

*Primary Examiner*—Eric F Winakur
*Assistant Examiner*—Michael T Rozanski

(57) ABSTRACT

In a magnetic resonance imaging data acquisition method, k-space (100) is divided into a central region (102) disposed at k-space center and one or more annular surrounding regions (104, 106) having increasing distances from k-space center. The one or more annular surrounding regions include an outermost surrounding region (106) having a largest distance from k-space center. The k-space samples in the central region (102) are acquired. Subsequent to the acquiring of k-space samples in the central region, k-space samples are acquired in the one or more annular surrounding regions (104, 106). The k-space samples in the outermost surrounding region (106) are acquired last. The acquiring of k-space samples in at least the outermost surrounding region uses a row-by-row acquisition ordering in which each row of k-space samples acquired in the outermost surrounding region (106) completes a k-space plane.

27 Claims, 8 Drawing Sheets

U.S. PATENT DOCUMENTS

| | | | |
|---|---|---|---|
| 6,380,740 B1 | 4/2002 | Laub | 324/309 |
| 6,518,759 B2 | 2/2003 | Bernstein | 324/307 |
| 6,611,144 B2 | 8/2003 | Abe | 324/309 |
| 6,639,211 B1 | 10/2003 | Anand et al. | 250/282 |
| 6,694,165 B2 * | 2/2004 | Zhu | 600/410 |
| 6,912,302 B2 | 6/2005 | Sato et al. | 382/131 |
| 2001/0033162 A1 | 10/2001 | Harvey et al. | 324/307 |

OTHER PUBLICATIONS

Wilman, A.H., et al.; Performance of an Elliptical Centric View Order for Signal Enhancement And Motion Artifact Suppression; 1997; MRM; 38:793-802.

Wilman, A.H., et al.; Improved Centric Phase Encoding Orders for Three-dimensional Magnetization-prepared MR Angiography; 1996; MRM; 36:382-392.

* cited by examiner

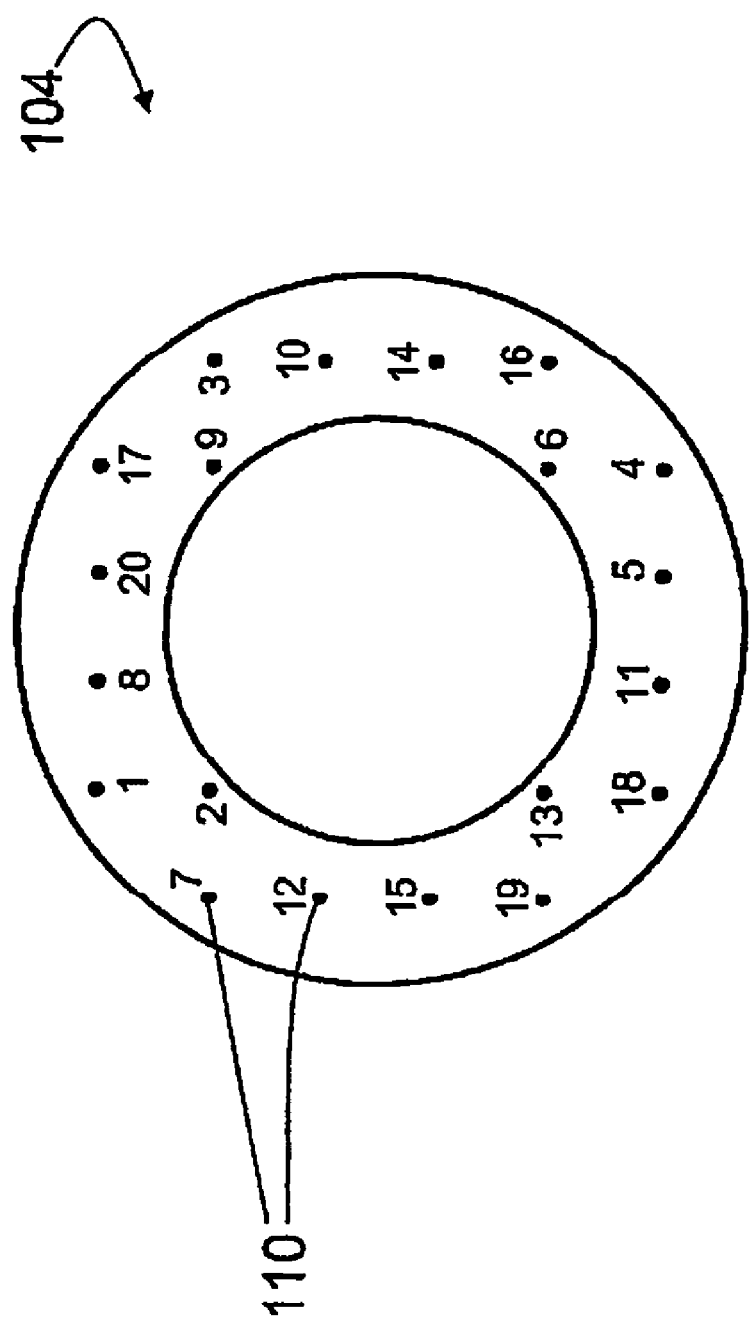

JUMPING AROUND THE CENTER OF K-SPACE IN ANNULAR SEQUENTIAL STEPS

CROSS REFERENCE TO RELATED APPLICATIONS

This application claims the benefit of U.S. provisional application Ser. No. 60/505,334 filed Sep. 23, 2003, and U.S. provisional application Ser. No. 60/583,883 filed Jun. 29, 2004, which are incorporated herein by reference.

DESCRIPTION

The following relates to the magnetic resonance arts. It finds particular application in magnetic resonance imaging during a transient magnetic contrast agent bolus, and will be described with particular reference thereto. However, it also finds application in magnetic resonance imaging of transient events generally, such as in gated magnetic resonance imaging.

In certain magnetic resonance imaging applications, k-space data is preferably acquired during a brief time interval. For example, in contrast-enhanced imaging the magnetic resonance imaging data are preferably acquired in the typically brief time interval during which the magnetic contrast agent bolus provides the most strongly enhanced magnetic resonance contrast in the tissue. In some contrast enhanced magnetic resonance angiography techniques, center of k-space data are collected while the contrast agent is in the arteries and before it arrives in the veins to provide good visualization of arterial flow by suppressing the not yet enhanced venous signal. As another example, in cardiac gated imaging the magnetic resonance imaging data are preferably acquired in a short time interval corresponding to a selected cardiac phase so as to reduce motion artifacts.

It will be appreciated that in these and similar applications the time interval for acquiring data is brief, but generally not well-defined. A contrast agent bolus, for example, typically produces a ramp-up in magnetic resonance signal intensity as the contrast agent washes into the imaged region. The slope of the signal intensity rise begins to level off until eventually a peak magnetic resonance signal intensity is reached. Beyond this intensity peak, the signal intensity begins to decrease as the contrast agent washes out of the imaged region. Hence, the brief time interval for optimal imaging is not well-defined, but it is usually advantageous to concentrate acquisition of data around the time of the maximum bolus signal intensity. For example, separation of arterial and venous signal is achieved by acquiring the center of k-space data while the bolus induced signal maximum occurs in the vessel of interest. Similarly, in gated cardiac imaging, the objective is to image a single cardiac phase; as the imaging time increases, the cardiac muscle increasingly deviates from the target cardiac phase.

To improve imaging of a transient event, it is known to order the k-space sampling so that k-space samples around the center of k-space are acquired closest to the optimal time, with k-space samples away from k-space center being acquired at less optimal times. For example, Riederer et al., U.S. Pat. No. 5,122,747 discloses a type of centric sampling in which the sampling trajectory spirals outward from k-space center, so that the initial k-space samples acquired at the optimum time are near k-space center. The k-space samples close to the center of k-space are low frequency samples that contribute substantially to the overall image. By distinction, k-space samples at larger distances from the center of k-space are high frequency samples that contribute to former details of the image. Hence, by acquiring samples near the center of k-space first, the samples that most contribute to the overall image are acquired closer to the bolus peak, target arterial or veneous phase, target cardiac phase, or other optimal time interval.

Although data acquisition techniques exist which advantageously concentrate data acquisition toward k-space center, these existing techniques have certain disadvantages. The data are not collected using a geometry that comports with typical Fourier transform-based reconstruction algorithms. Hence, a substantial amount of sorting of k-space samples is usually required to prepare the collected imaging data for image reconstruction processing. Such sorting can be computationally intensive, slowing down the data processing and delaying generation of useful images.

Moreover, by collecting data spiraling out from the center, substantially the entire data set must be collected before there is a completely acquired plane of k-space on which to begin Fourier-based image reconstruction. This prevents concurrent data acquisition and image reconstruction processing, which further delays the generation of useful images.

Yet another problem with existing techniques is that they typically involve applying a substantial number of large magnetic field gradient steps in order to follow the complex centric or other selected k-space acquisition trajectory. These large magnetic field gradients can generate eddy currents that contribute to image artifacts.

The present invention contemplates improved apparatuses and methods that overcome the aforementioned limitations and others.

According to one aspect, a magnetic resonance imaging method is provided. A k-space is divided into a central region disposed at k-space center and one or more annular surrounding regions having increasing distances from k-space center. The one or more annular surrounding regions including an outermost surrounding region having a largest distance from k-space center. The k-space samples in the central region are acquired. Subsequent to the acquiring of k-space samples in the central region, k-space samples in the one or more annular surrounding regions (104, 106) are acquired. The k-space samples in the outermost surrounding region (106) are acquired last. The k-space samples are acquired in at least the outermost surrounding region using a row-by-row data acquisition ordering in which each row of k-space samples acquired in the outermost surrounding region, together with selected already-acquired k-space data from the regions other than the outermost surrounding region, forms a completed data set for reconstructing an image plane. Each completed data set is reconstructed into a reconstructed image plane without waiting for all k-space samples in the outermost surrounding region to be acquired such that the reconstructing occurs at least partially concurrently with the acquiring.

According to another aspect, a magnetic resonance imaging apparatus is disclosed. A magnetic resonance imaging scanner images an associated imaging subject. A magnetic resonance imaging controller performing a method including: (i) dividing k-space into a central region disposed at k-space center and one or more annular surrounding regions having increasing distances from k-space center and including an outermost surrounding region of largest distance from k-space center; (ii) determining an optimum time for imaging a magnetic contrast agent bolus; (iii) acquiring k-space samples in the central region at about the optimum time, and (iv) after acquiring the k-space samples in the central region, acquiring k-space samples in the one or more annular surrounding regions. The acquiring in at least the outermost surrounding region uses a plane-by-plane data acquisition ordering in which all k-space samples in the outermost surrounding region belonging to a current k-space plane are acquired to complete the current k-space plane before samples in the outermost surrounding region belonging to other k-space planes are acquired. A reconstruction processor reconstructs the completed current k-space plane into a reconstructed plane image without waiting for other k-space planes to be completed.

According to yet another aspect, a magnetic resonance imaging apparatus is disclosed. A means is provided for dividing k-space into a central region disposed at k-space center and one or more annular surrounding regions having increasing distances from k-space center. The one or more annular surrounding regions include an outermost surrounding region having a largest distance from k-space center. A means is provided for acquiring k-space samples in the k-space. The k-space samples in the central region are acquired first The k-space samples in the outermost surrounding region are acquired last. The k-space samples in at least the outermost surrounding region are acquired using a row-by-row data acquisition ordering in which each row of k-space samples acquired in the outermost surrounding region completes a k-space plane. A means is provided for reconstructing each completed k-space plane into a reconstructed image plane without waiting for all k-space samples in the outermost surrounding region to be acquired.

One advantage resides in shortened imaging session times.

Another advantage resides in reduced image artifacts.

Another advantage resides in enabling concurrent imaging data acquisition, reconstruction, and display processing.

Yet another advantage resides in reduced data sorting complexity.

Still yet another advantage resides in reduced generation of eddy currents.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system.

Figure 6:
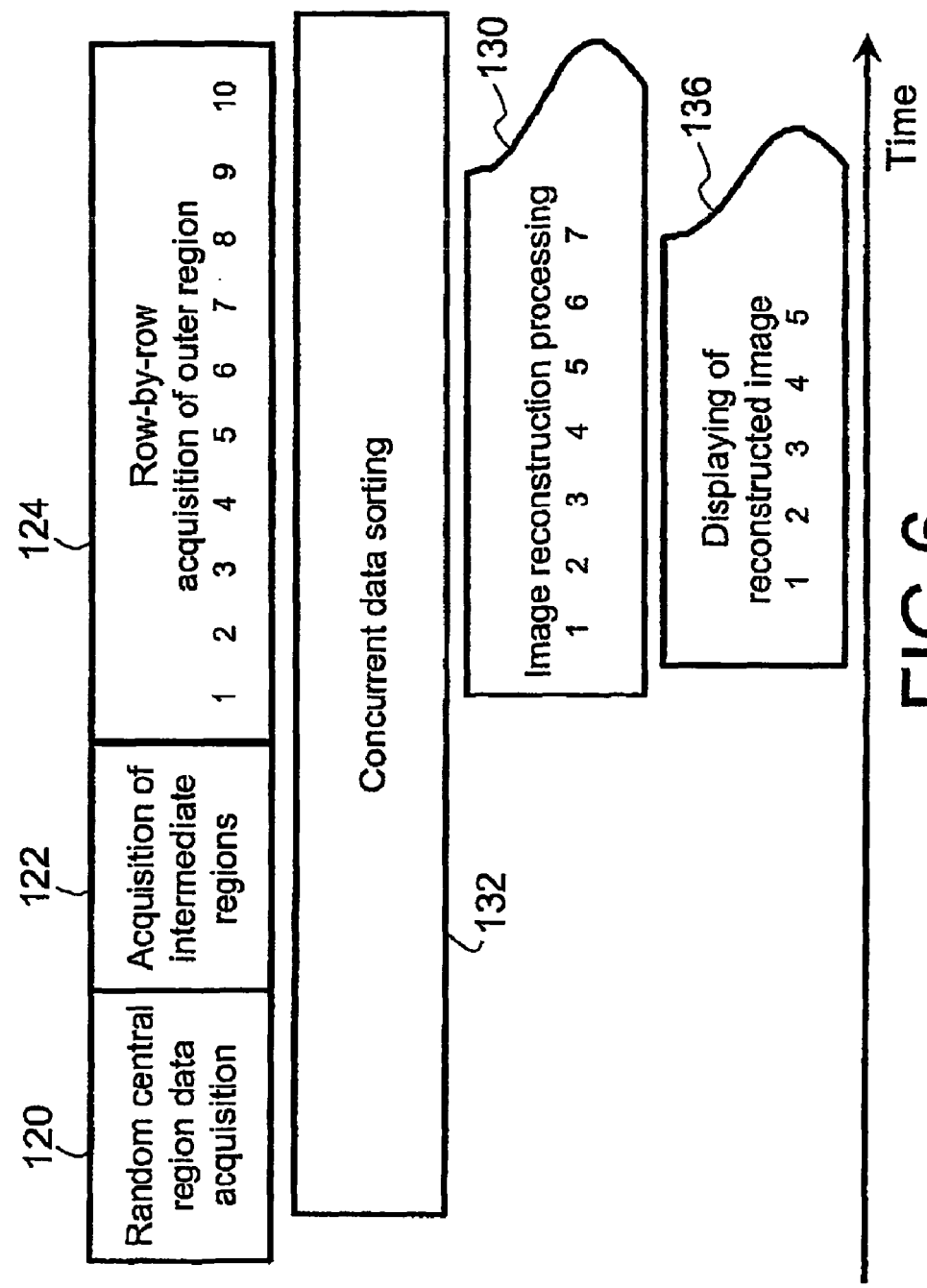

FIG. 6 diagrammatically shows relative timing of the data acquisition, the data reconstruction, and the data display aspects of the imaging.

Figure 1:
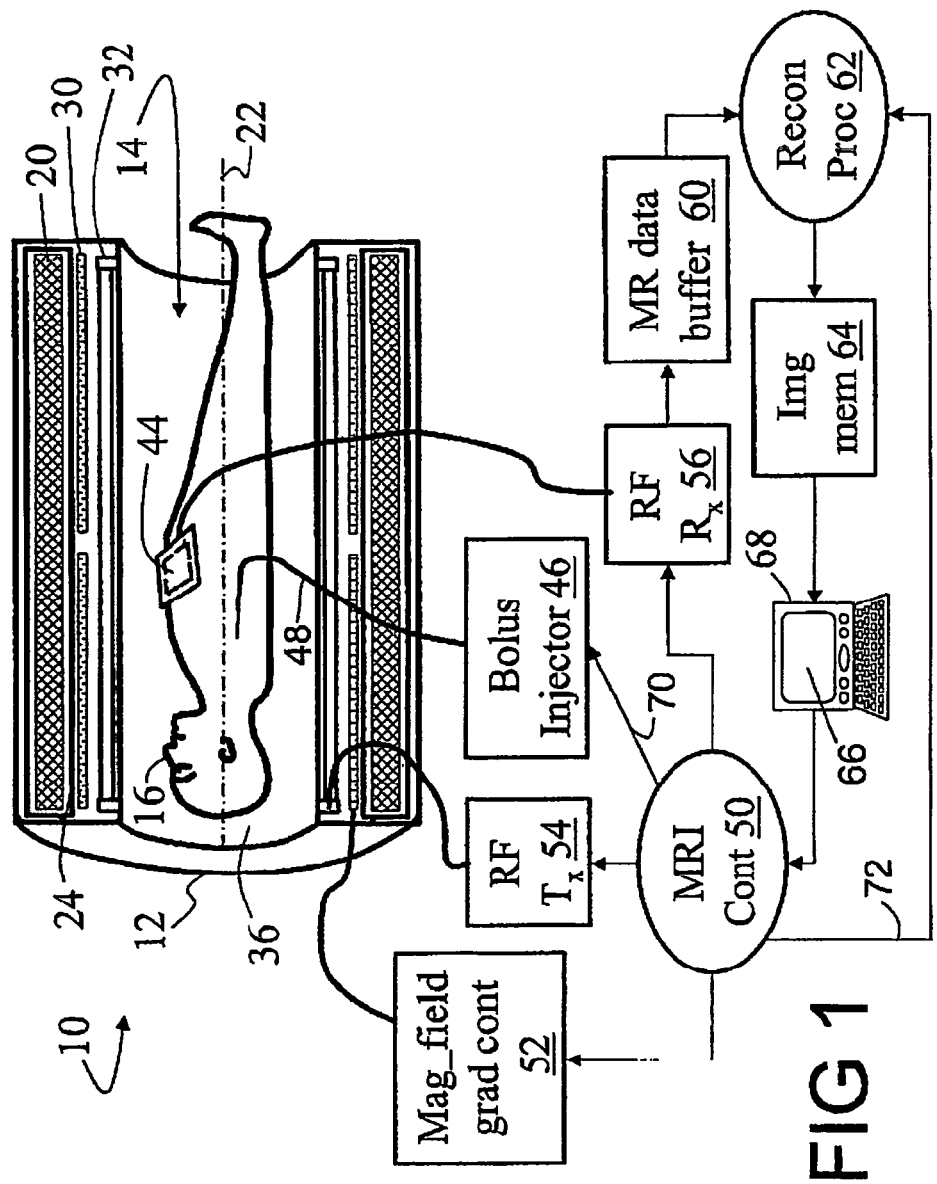
Figure 7:
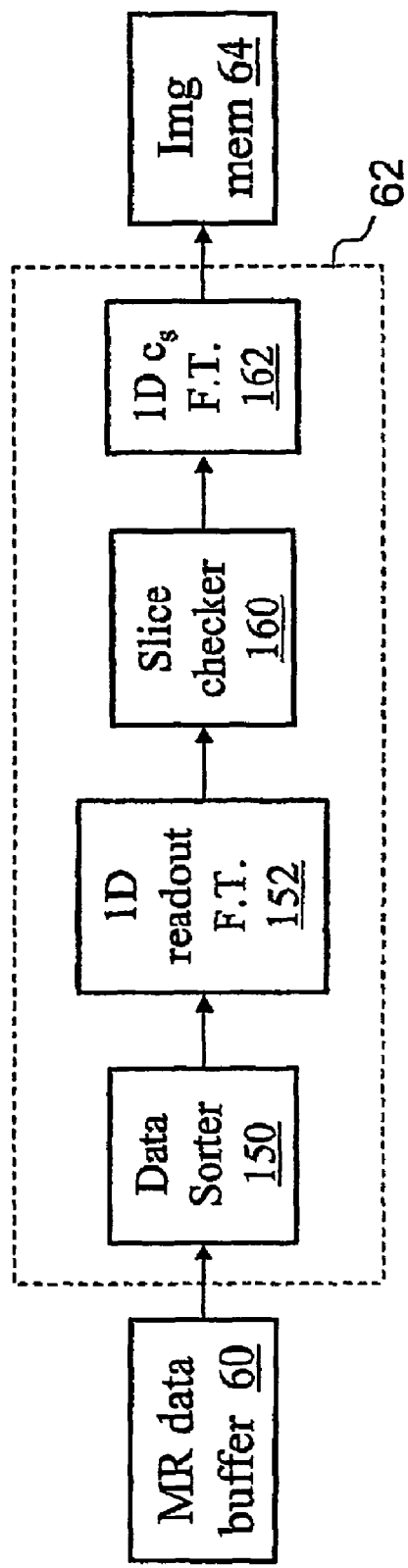

FIG. 7 shows a suitable embodiment of the reconstruction processor of FIG. 1.

FIG. 8 shows a suitable random or pseudorandom acquisition ordering for k-space samples lying in the inner annular surrounding k-space region.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a main $B_0$ magnetic field directed generally parallel with a central axis 22 of the scanner bore 14. The main magnetic field coils 20 are typically superconducting coils disposed inside cryoshrouding 24, although resistive main magnets can also be used. The housing 12 also houses or supports magnetic field gradient coils 30 for selectively producing magnetic field gradients in the bore 14. The housing 12 further houses or supports a radio frequency body coil 32 for selectively exciting and/or detecting magnetic resonances. The housing 12 typically includes a cosmetic inner liner 36 defining the scanner bore 14. For some imaging applications, one or more local radio frequency coils such as a surface coil 44 may be used for radio frequency excitation and/or detection.

In contrast-enhanced magnetic resonance imaging, a bolus injector 46 is used to rapidly infuse a selected magnetic contrast agent, such as a gadolinium-based contrast agent, into the imaging subject 16. For a bolus injection into the bloodstream of a human imaging subject, the contrast agent rapidly washes into and out of tissue of interest. The bolus transit time between wash-in and wash-out is typically on the order of a few seconds. In the illustrated embodiment, the bolus injector 46 is coupled into the bloodstream of the imaging subject 16 by a catheter 48.

A magnetic resonance imaging controller 50 operates magnetic field gradient controllers 52 to selectively energize the magnetic field gradient coils 30, and operates a radio frequency transmitter 54 coupled to the radio frequency coil 32 as shown, or coupled to a local coil such as the surface coil 44, to selectively inject radio frequency excitation pulses into the imaging subject 16. By selectively operating the magnetic field gradient coils 30 and the radio frequency coil 32, magnetic resonance is generated and spatially encoded in at least a portion of a region of interest of the imaging subject 16. During imaging data acquisition, the magnetic resonance imaging controller 50 operates a radio frequency receiver 56 coupled to the radio frequency surface coil 44 as shown, or coupled to the whole body coil 32, to acquire magnetic resonance samples that are stored in a magnetic resonance data buffer 60.

The acquired imaging data are reconstructed by a reconstruction processor 62 into an image representation, typically using a Fourier transform-based reconstruction algorithm The reconstructed image or images generated by the reconstruction processor 62 are stored in an images memory 64, and can be displayed on a display device 66 of a user interface 68, stored in non-volatile memory, transmitted over a local intranet or the Internet, viewed, stored, manipulated, or so forth. The user interface 68 also preferably enables a radiologist, technician, or other operator of the magnetic resonance imaging scanner 10 to communicate with the magnetic resonance imaging controller 50 to select, modify, and execute magnetic resonance imaging sequences.

The described magnetic resonance imaging system is an illustrative example only. The magnetic resonance data acquisition techniques described herein can be used with substantially any type of magnetic resonance imaging scanner, including but not limited to horizontal bore scanners, vertical bore scanners, open magnet scanners, and so forth. Moreover, the magnetic resonance data acquisition techniques described herein can be employed in conjunction with arrays of receive coils for parallel imaging, SENSE imaging, and the like.

In contrast enhanced imaging, the bolus injector 46 administers a magnetic contrast agent bolus to the imaging subject 16. When administered into the bloodstream, the bolus washes into the imaging region of interest, and then washes out, typically on the order of a few seconds. Accordingly, the imaging data acquisition is preferably timed to acquire imaging data at the peak of the magnetic contrast provided by the bolus in the imaging region of interest. As will be described, the imaging data is acquired in a manner in which k-space samples in a region near the center of k-space are acquired first, followed by samples in regions at larger distances from k-space center. In one approach for timing the imaging, the magnetic resonance imaging controller 50 sends a bolus triggering signal 70 to the bolus injector 46. The bolus injector 46 administers the bolus via the catheter 48 responsive to receiving the bolus triggering signal 70. The magnetic resonance imaging controller 50 initiates the magnetic resonance imaging data acquisition at a pre-selected time after sending the bolus triggering signal 70, where the pre-selected time corresponds to the time it takes for the administered bolus to wash into the imaging region of interest.

In another approach for timing the imaging data acquisition, the scanner 10 excites and acquires a projection or other magnetic resonance signal from the region of interest. The magnetic resonance imaging controller 50 monitors the intensity of this signal. The bolus injector 46 administers the magnetic contrast agent bolus. As the administered bolus washes into the imaging region of interest, the intensity of the projection or other magnetic resonance signal changes accordingly. The magnetic resonance imaging controller 50 detects this change and begins image data acquisition. In yet other embodiments, such as in cardiac gated imaging, the magnetic resonance imaging controller 50 uses a suitable cardiac gating signal, for instance extracted from an electrocardiograph signal, to trigger data acquisition. Similarly, substantially any other physiological event can be detected and used to trigger initiation of magnetic resonance imaging of a volume of interest affected by the physiological event.

Figure 2:
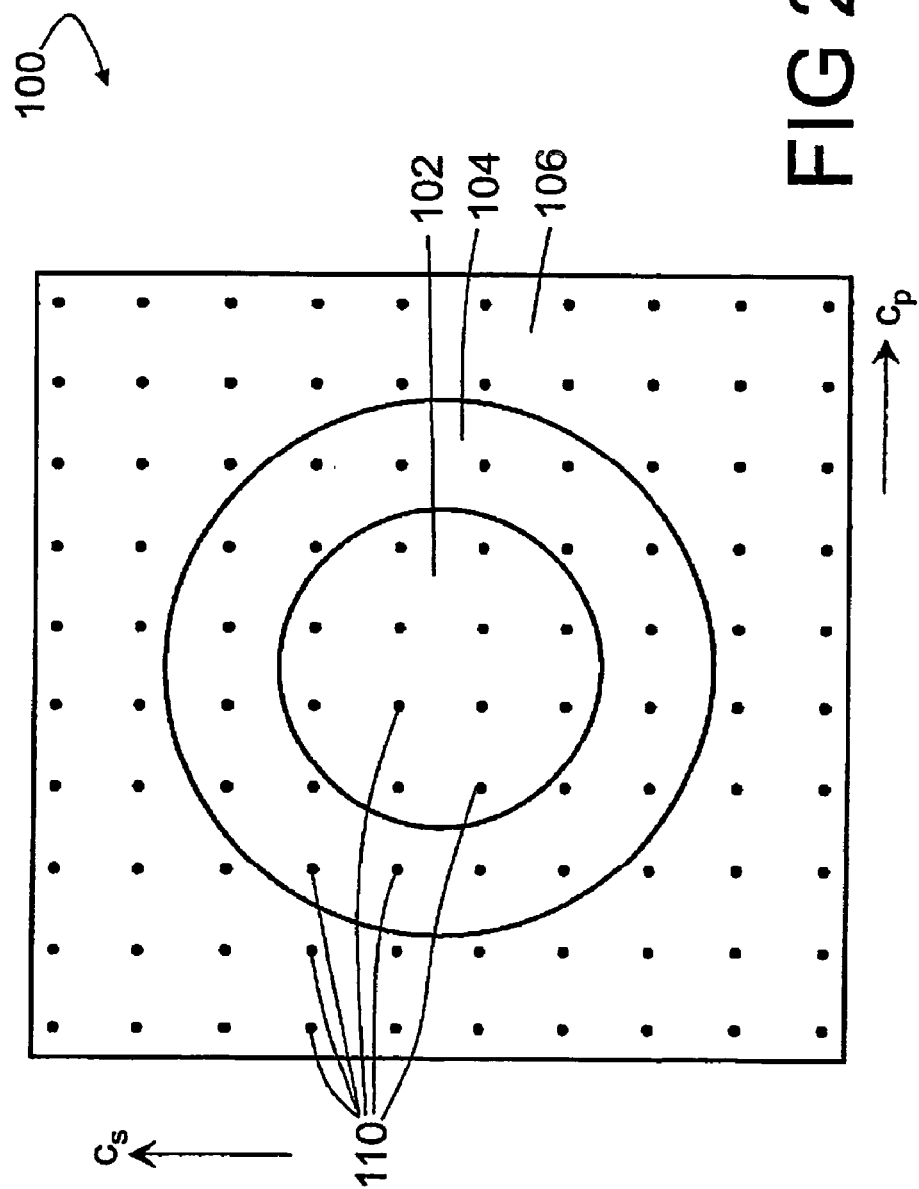
FIG. 2 shows the division of the k-space sampling into (i) a central region disposed at k-space center, and (ii) two annular surrounding regions.

With continuing reference to FIG. 1 and with further to FIGS. 2-5, the magnetic resonance imaging controller 50 divides k-space 100 into a central region 102 disposed at k-space center and one or more annular surrounding regions having increasing distances from k-space center, namely two annular surrounding regions 104, 106 in the example embodiment illustrated in FIG. 2. The k-space representations of FIGS. 2-5 show a view perpendicular to a primary data acquisition coordinate designated "$c_p$", and perpendicular to an orthogonal secondary data acquisition coordinate designated "$c_s$". An unlabeled readout coordinate is oriented transverse to illustrated the primary $c_p$ and secondary $c_s$ coordinates, and hence parallel with the direction of view. In some embodiments, the $c_p$ coordinate is a slice-select coordinate while the $c_s$ coordinate is a phase-encode coordinate; however, the primary and secondary coordinates can have substantially arbitrary spatial orientations. For example, the phase-encode direction could be designated the primary coordinate $c_p$ while the slice-select direction could be designated the secondary coordinate $c_s$, or one or both of primary $c_p$ and secondary $c_s$ coordinates may be inclined to the conventional sagittal, coronal, and axial anatomical coordinates. Moreover, while in the illustrated embodiment the primary $c_p$, secondary $c_s$, and readout data acquisition coordinates are mutually orthogonal, in some contemplated embodiments a non-orthogonal data acquisition coordinates system may be employed.

In FIGS. 2-5, a rectangular grid of k-space samples 110 is illustrated. In these FIGURES, each k-space sample or readout line is depicted as a dot. The illustrated grid is 10×10 for simplicity of illustration. In practice, grids of 128×128 to 1024×1024 are routine. In embodiments in which a three-dimensional volume is imaged, these k-space samples 110 each correspond to a readout line of k-space data that extends along the readout coordinate (that is, extends transverse to the primary $c_p$ and secondary $c_s$ coordinates, and thus appears as a dot from the perspective of FIGS. 2-5). Although a square 10×10 grid of samples is illustrated, the number of samples in the $c_p$ and $c_s$ directions can be different. In such three-dimensional volume imaging, the central region 102 will extend into the readout direction to define a generally cylindrical central region, while the annular regions 104, 106 will similarly extend into the readout direction to define three-dimensional annular volumes surrounding the cylindrical central region volume 102.

Figure 3:
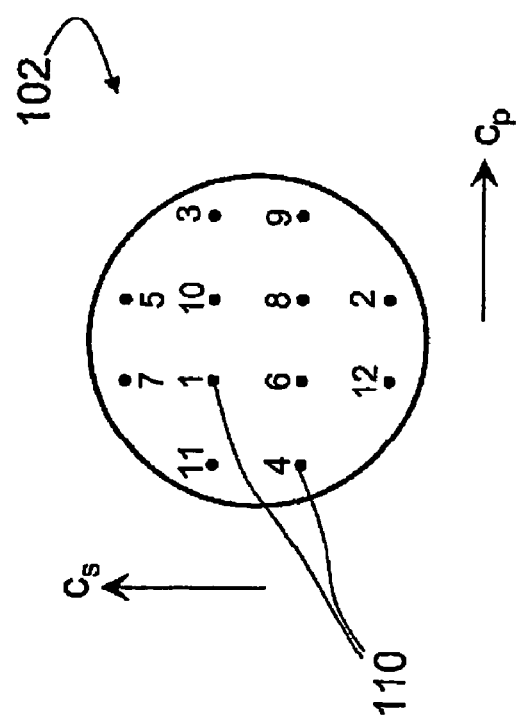
FIG. 3 shows a suitable random or pseudorandom acquisition ordering for k-space samples lying in the central k-space region.
Figure 4:
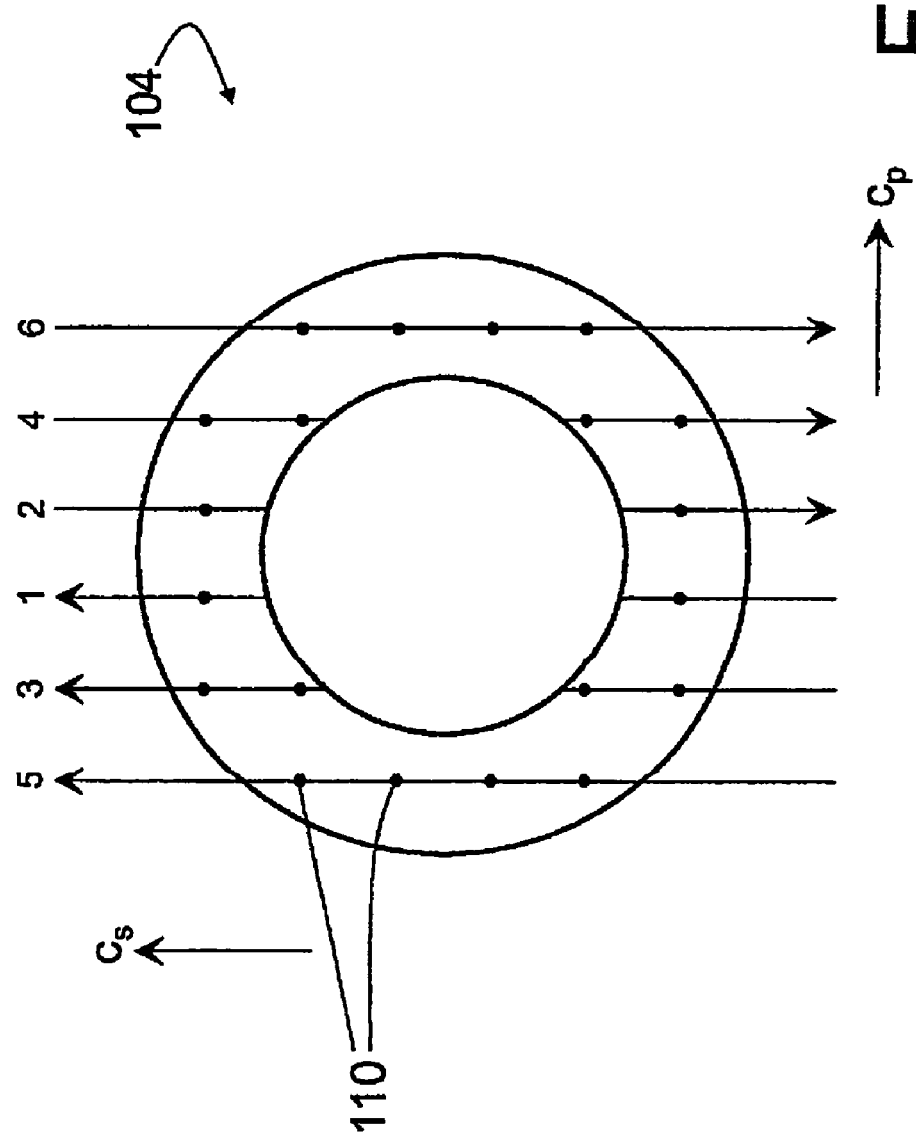
FIG. 4 shows a suitable row-by-row acquisition ordering for k-space samples lying in the inner annular surrounding k-space region.
Figure 5:
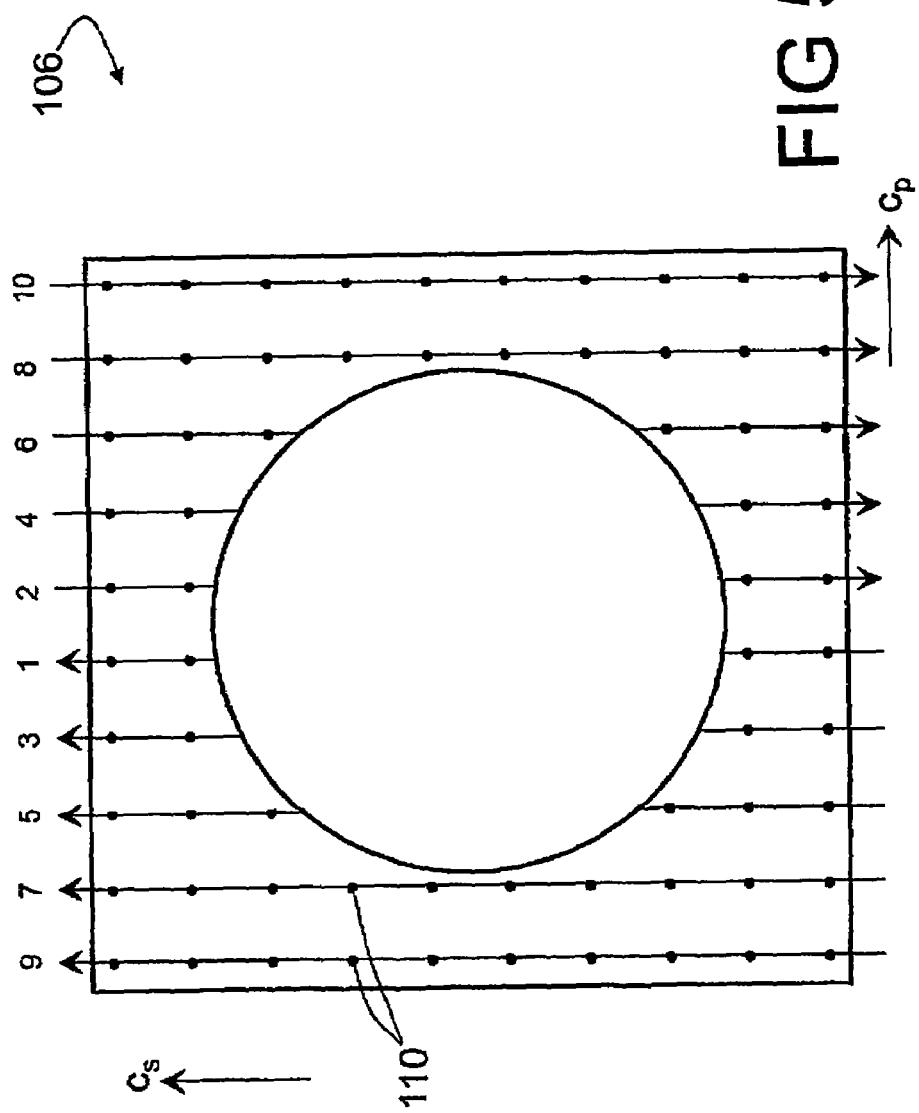
FIG. 5 shows a suitable row-by-row acquisition ordering for k-space samples lying in the outermost annular k-space region.

The magnetic resonance imaging controller 50 acquires the central region 102 first using an acquisition ordering shown in FIG. 3, and then acquires the inner annular surrounding region 104 using an acquisition ordering shown in FIG. 4, and formally acquires the outermost annular surrounding region 106 using an acquisition ordering shown in FIG. 5. Some preferred sampling orderings for use in acquiring data from each of these regions 102, 104, 106 is next described.

With particular reference to FIG. 3, each k-space sample 110 in the central region 102 is labeled with its ordinal number in the acquisition sequence. The example central region 102 encompasses twelve k-space samples labeled with ordinal numbers 1, 2, 3, . . . 12. In the illustrated embodiment, a substantially random or pseudorandom ordering of the k-space samples acquisition is used for acquiring the k-space samples in the central region 102. A random or pseudorandom ordering for acquiring samples of the central region 102 advantageously provides robustness with respect to errors in triggering the data acquisition. If the magnetic resonance data acquisition is triggered slightly early or slightly late such that the peak intensity contrast provided by the magnetic contrast agent bolus does not precisely coincide with acquisition of the central region 102, then this random or pseudorandom ordering reduces the sensitivity of the image quality to this triggering error. In this context, "random or pseudorandom" is intended to encompass, in addition to the ordinary meaning of those terms, any pre-determined ordering selected to have statistical characteristics similar to those of a random or pseudorandom ordering.

A random or pseudorandom ordering typically has some cost in terms of increased magnetic field gradients employed to follow large jumps between the random sampling positions. However, because the central region 102 is generally relatively small and close to the center of k-space, the magnetic field gradients required to make the random jumps within the central region 102 are typically acceptable. Alternatively, a centric or other ordering that collects the k-space samples closest to the center of k-space can be used in the central region 102 instead of the illustrated random or pseudorandom ordering.

With particular reference to FIG. 4, once all the k-space samples in the central region 102 are acquired, the magnetic resonance imaging controller 50 acquires k-space samples in the inner surrounding annular region 104 using a serpentine row-by-row acquisition ordering that is designed to acquire a row of readout samples having a given $c_p$ coordinate value as a group (that is, designed to acquire a row of readout samples along the $c_s$ coordinate direction) while limiting the magnitudes of the applied magnetic field gradients. The acquisition order of the k-space samples is represented in FIG. 4 where each acquired row of samples is indicated by an arrow labeled by its ordinal number of plane acquisition. In FIG. 4, there are six rows labeled 1, 2, 3, 4, 5, 6. The direction of the arrow indicates the direction the row of samples is traversed during data acquisition. The first acquired sample is at the bottom of FIG. 4 around the center position of the primary $c_p$ coordinate. Starting at this k-space sample, acquisition of a row of samples traverses a positive or upward direction in $c_s$ coordinate, and does not include acquisition of those k-space samples along the row which lie inside the central region 102 and which thus have already been required. It will be appreciated that traversing this row of k-space samples involves gradient steps in the secondary $c_s$ coordinate direction, without application of any gradients in the primary $c_p$ direction.

Once the first row of k-space samples are acquired, a gradient pulse in the primary $c_p$ direction is applied to move to another row, which also lies near the center position of the primary $c_p$ coordinate. This second row of k-space samples is traversed in the negative or downward direction, that is, the second row is traversed in the opposite direction from the first row. The second row is also traversed using only secondary $c_s$ coordinate gradient pulses, without application of any gradients in the primary $c_p$ direction.

Once the second row k-space samples is acquired, a gradient pulse in the primary $c_p$ direction is applied to move to the third row, which lies further out from the center position of the primary $c_p$ coordinate. The third row of samples is traversed in the positive or upward direction. Once the third row of k-space samples is acquired, a gradient pulse in the primary $c_p$ direction is applied to move to the fourth row, which is traversed in the negative or downward direction. Once the fourth row of k-space samples is acquired, a gradient pulse in the primary $c_p$ direction is applied to move to the fifth row, which lies at an edge of the surrounding annular region 104. The fifth row of k-space samples is traversed in the positive or upward direction. Once the fifth row of k-space samples is acquired, a gradient pulse in the primary $c_p$ direction is applied to move to the sixth and final row of k-space samples intersecting the surrounding region 104, which lies at the opposite edge of the surrounding annular region 104. The sixth row of k-space samples is traversed in the negative or downward direction.

The described row-by-row acquisition pattern in the inner surrounding annular region 104 has certain advantages. In three-dimensional Fourier-encoded imaging, each k-space sample 110 corresponds to a readout line of k-space in the readout direction. Hence, a row of k-space samples corresponds to a plane of k-space. This plane of k-space can be transformed into a reconstructed image plane using two-dimensional Fourier-based reconstruction processing, thus eliminating data processing delays caused by complex sorting operations. Moreover, the row-by-row acquisition ordering limits the magnitudes of changes in amplitude of the magnetic field gradients used in traversing the trajectory, which reduces eddy currents that can lead to image artifacts.

With particular reference to FIG. 5, once all the k-space samples in the central region 102 and in the inner annular surrounding region 104 are acquired, the magnetic resonance imaging controller 50 acquires k-space samples in the outermost surrounding annular region 106 using the same type of row-by-row acquisition ordering used in acquiring samples in the inner region 104. The acquisition of each row of k-space samples is represented in FIG. 5 by an arrow labeled by its ordinal number of acquisition. There are ten row of k-space samples labeled 1, 2, 3, . . . , 10. The direction of the arrow indicates the direction the row of k-space samples is traversed during the data acquisition. In similar fashion to the acquisition ordering used in the inner surrounding region 104, the row of the outermost surrounding region 106 are acquired such that the first and second rows having primary $c_p$ coordinate values closest to the center of the outermost region 106 are acquired first, and rows with increasing primary coordinate $c_p$ value are subsequently acquired, finishing with acquisition of the ninth and tenth rows of k-space samples located at the opposite edges of the outermost annular region 106, respectively. The direction of acquisition of samples along a row in the secondary $c_s$ direction reverses at the beginning of each new row to limit applied magnetic field gradient magnitudes. Thus, rows 1, 3, 5, 7, 9 are traversed in the positive or upward direction, while rows 2, 4, 6, 8, 10 are traversed in the negative or downward direction. When acquiring the k-space data of the outermost surrounding region 106, k-space samples along the row which lie in the central region 102 or in the inner annular surrounding region 104, and which have thus already been acquired, are not re-acquired during the row-by-row sampling of the outermost surrounding region 106.

With continuing reference to FIGS. 1-5 and with further reference to FIG. 6, the row-by-row acquisition of the outermost annular surrounding region 106 advantageously enables image reconstruction to initiate before all k-space data is acquired, and allows image reconstruction to be performed substantially concurrently with data acquisition once a full row of k-space samples (corresponding to a plane of k-space) has been acquired. As diagrammatically shown in FIG. 6, the k-space samples in the central region 102 are acquired during a time interval 120, followed by acquisition of the k-space samples in the inner annular surrounding region 104 during a subsequent time interval 122. At the end of the second acquisition time interval 122, no plane of k-space has been fully sampled, since the outermost annular region 106 includes at least some k-space samples from every plane of k-space in the imaging volume.

The row-by-row sampling of the outermost annular region 106 is performed during a time interval 124 following the time interval 122. Once the first row of k-space samples is acquired, all the data for a full plane of k-space are available, and reconstruction of that plane can be initiated by the reconstruction processor 62.

By way of example, when the primary $c_p$ direction is the slice-select direction, the secondary $c_s$ direction is the phase-encode direction, and the unlabeled direction perpendicular to $c_p$ and $c_s$ is the readout direction, acquisition of a row of k-space samples corresponds to acquiring all phase-encode steps for a selected slice. As soon as all of the k-space samples along the first row of the outermost region 106 are acquired by traversing the phase-encode steps along the row for that selected slice (jumping over those phase-encode steps already acquired during acquisition of regions 102, 104), the central slice can be reconstructed. When all of the data along row 2 is collected, the adjoining slice can be reconstructed, and so forth. Moreover, the same principle applies for other two-dimensional planes through three-dimensional k-space.

Hence, a reconstruction time interval 130 initiates subsequent to completion of sampling of the first row of k-space samples in the outermost annular region 106. The reconstruction may extend beyond the time interval 124 during which the samples in the outermost annular region 106 are acquired (as indicated by the curved right-side "break" of the reconstruction time interval 130 in FIG. 6); however, substantial data processing speedup is obtained through the partial overlap of the acquisition time interval 124 and the reconstruction time interval 130.

With brief returning reference to FIG. 1, in one suitable embodiment, the magnetic resonance imaging controller 50 sends a reconstruction trigger signal 72 to the reconstruction processor 62 each time a row of k-space samples has been completely acquired. Receipt of the reconstruction trigger signal 72 causes the reconstruction processor 62 to begin reconstruction of the corresponding image plane. In another approach, the reconstruction processor 62 monitors the sampling data buffer 60 to determine when acquisition of a row of k-space samples has been completed.

With returning reference to FIG. 6, the data processing does not involve a substantial amount of data sorting. The surrounding regions 104, 106 are acquired on a row-by-row basis that comports with two-dimensional Fourier reconstruction, so that substantial sorting is not required for those data. The data from the central region 102 is randomized or pseudorandomized and it must be sorted; however, this sorting is performed contemporaneous with the acquisition of the data, with each sample placed into a position in the data buffer corresponding to its k-space coordinates as the next sample is being acquired.

Still further, since the reconstruction processor 62 reconstructs each plane as its k-space data acquisition is completed during the acquisition interval 124, the image of that reconstructed plane can be displayed by the display device 66 in a displaying time interval 136 that at least partially overlaps the acquisition time interval 124 and the reconstruction time interval 130. Thus, the image begins to be displayed even while data acquisition is ongoing.

With reference to FIG. 7, a suitable embodiment of the reconstruction processor 62 is described. In some embodiments, the sorting of the data is determined prior to the acquisition and the expected acquisition order is provided to the reconstruction processor 62 in an array of k-space points determined by the magnetic resonance imaging controller 50. Hence, no sorting is performed during reconstruction beyond the initial placement of each data sample into a location in the data buffer corresponding to its position in k-space by means of a data sorter 150. With reference to FIG. 6, this sorting by the reconstruction processor 62 during the time interval 132 is performed concurrently with the acquiring and reconstructing of the data.

In three-dimensional imaging, each k-space sample 110 corresponds to a readout line in the readout direction which is orthogonal to the primary $c_p$ and secondary $c_s$ directions. Accordingly, a one-dimensional Fourier transform 152 is applied to each k-space sample to recover the spatial content in the readout direction.

Within the reconstruction processor 62, a slice checker 160 determines when a complete row of k-space samples, corresponding to a complete data set for reconstructing an image plane, has been acquired. Alternately, a reconstruction trigger signal 72 (see FIG. 1) could indicate when an image plane data set has been acquired. The completed data set, which has already been sorted by the data sorter 150 and Fourier transformed in the readout direction by the Fourier transform processor 152, is processed by a second one-dimensional Fourier transform processor 162 operating in the secondary $c_s$ coordinate direction to recover the spatial content along the secondary $c_s$ coordinate direction. The output of the second one-dimensional Fourier transform processor 162 is a reconstructed image of the just-completed primary $c_p$ plane. As acquisition of each row of k-space samples corresponding to an image plane is completed during the time interval 124, that just-completed image plane data set is similarly reconstructed.

The dividing up and sampling of k-space illustrated in FIGS. 2-5 is only an example. In some contemplated embodiments, the inner surrounding region 104 is omitted, i.e., the data are divided between a randomly acquired central region and a peripheral region that is acquired row-by-row. In other contemplated embodiments, the number of surrounding annular regions is greater than two. As shown in FIGS. 2 and 5, the example outermost annular region 106 has a circular or oval inner boundary and a square or rectangular outer boundary (in the $c_p$-$c_s$ plane). Thus, it will be appreciated that the annular surrounding regions can have various cross-sectional shapes.

The advantageous at least partial concurrency of data acquisition and reconstruction (and optionally also concurrent displaying) is obtained only during acquisition of k-space samples in the outermost region 106, that is, only during the time interval 124. Accordingly, there are advantages to making the outermost region large so that it contains a large fraction of the k-space samples compared with inner regions 102, 104, thus enabling a large overlap of data acquisition and image reconstruction.

On the other hand, the row-by-row acquisition employed in the outermost region 106 is not strongly biased toward acquiring data near the center of k-space, and so making the outermost region 106 too large can increase temporal artifacts. To reduce temporal artifacts, the central region 102 should be made larger so that central k-space samples that contribute strongly to the overall image are acquired first.

As the central region 102 is enlarged, however, the sorting time prior to data acquisition is increased, causing an increase in acquisition planning time. Moreover, if the central region 102 is too large it will contain k-space samples relatively distant from k-space center. Including one or more inner surrounding annular regions such as the inner surrounding annular region 104, sampled on a row-by-row basis as shown in FIG. 4, provides a balance by biasing the early portion of the acquisition toward k-space center while providing a row-by-row acquisition ordering that is conducive to rapid data processing.

In some embodiments, the size of the central region 102 is determined as follows. The magnetic resonance imaging parameters for the acquiring of k-space samples is determined. These parameters include a data acquisition rate. The time interval 120 for acquiring samples in the central region 102 is also selected, for example based on an expected duration of the magnetic contrast agent bolus in the tissue of interest. Based on the data acquisition rate and the selected time interval 120, the number of k-space samples of the central region 102 is determined, and a suitable central region 102 corresponding to this number of samples is selected.

With reference to FIG. 8, in some embodiments it is contemplated to use an ordering other than serpentine row-by-row ordering for the surrounding annular regions other than the outermost surrounding annular region. FIG. 8, for example, shows an example of a random or pseudorandom sampling ordering for the inner surrounding annular region 104. Substituting the random or pseudorandom sampling of FIG. 8 for the row-by-row ordering of FIG. 4 can be advantageous for certain imaging tasks. For example, this approach provides additional robustness against triggering time errors by extending the range of the random or pseudorandom sampling further out away from k-space center, while the separate random or pseudorandom sampling of each of the central region 102 and the inner surrounding region 104 ensures that the random or pseudorandom sampling covers all the k-space samples within the boundary of the central region 102 before sampling outside of central region 102. However, it will be recognized that the random or pseudorandom sampling of the inner surrounding region 104 increases the required data sorting time.

Although not illustrated, in some embodiments it is contemplated to employ a row-by-row acquisition ordering for the central region 102 and for the one or more surrounding annular regions 104, 106. Row-by-row ordering does not by itself strongly bias the early sampling toward k-space center; however, by using a relatively small central region 102 and one or more relatively small inner surrounding annular regions 104 biasing of the early sampling toward k-space center can be achieved. Moreover, since in these embodiments all regions including the central region 102 are sampled on a row-by-row basis, sorting delays in the subsequent data processing are substantially reduced.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging method comprising:
    dividing k space into a central region disposed at k space center and one or more annular surrounding regions having increasing distances from k space center, the one or more annular surrounding regions including an outermost surrounding region having a largest distance from k space center;
    acquiring k space samples in the central region;
    subsequent to the acquiring of k space samples in the central region, acquiring k space samples in the one or more annular surrounding regions, the k space samples in the outermost surrounding region being acquired last, the acquiring of k space samples in at least the outermost surrounding region using a row by row data acquisition ordering in which each row of k space samples acquired in the outermost surrounding region, together with selected already acquired k space data from the regions other than the outermost surrounding region, forms a completed data set for reconstructing an image plane; and
    reconstructing each completed data set into a reconstructed image plane without waiting for all k space samples in the outermost surrounding region to be acquired such that the reconstructing occurs at least partially concurrently with the acquiring
    wherein each of the above steps is performed on a magnetic resonance imaging scanner.

2. The method as set forth in claim 1, further comprising:
    displaying each reconstructed image plane once it is available without waiting for the reconstructing of other image planes.

3. The method as set forth in claim 1, further comprising:
    synchronizing the acquiring of k space samples in the central region with a trigger signal, the trigger signal being one of: (i) a selected duration after administering a magnetic contrast agent bolus, (ii) detecting a change in a magnetic resonance signal intensity due to wash in of a magnetic contrast agent bolus, (iii) detecting a gating signal, and (iv) detecting a selected physiological event.

4. The method as set forth in claim 1, further comprising:
    selecting a plurality of magnetic resonance imaging parameters for the acquiring of k space samples in the central region and in the one or more annular surrounding regions, the plurality of magnetic resonance imaging parameters including at least a data acquisition rate; and
    determining the central region using (i) the selected plurality of magnetic resonance imaging parameters and (ii) a time interval for the acquiring of k space samples in the central region.

5. The method as set forth in claim 1, wherein the central region has a round or oval perimeter, and the outermost surrounding region has a round or oval inner perimeter and a square or rectangular outer perimeter.

6. The method as set forth in claim 1, wherein the acquiring of k space samples in the central region uses an acquisition ordering other than a row by row acquisition ordering.

7. The method as set forth in claim 6, wherein the acquiring of k space samples in the central region uses a random or pseudorandom ordering.

8. The method as set forth in claim 7, further comprising:
    synchronizing the acquiring of k space samples in the central region with the administering of a magnetic contrast agent bolus.

9. The method as set forth in claim 6, further comprising:
    sorting the k space samples of the central region into a row by row ordering.

10. The method as set forth in claim 1, wherein the one or more annular surrounding regions include at least two surrounding regions, and the acquiring of k space samples in the one or more annular surrounding regions other than the outermost surrounding region uses a random or pseudorandom ordering.

11. The method as set forth in claim 1, wherein the one or more annular surrounding regions include at least two surrounding regions, and the acquiring of k space samples in every annular surrounding region including the outermost surrounding region uses a row by row acquisition ordering.

12. The method as set forth in claim 1, wherein each k space sample is a readout line of k space.

13. The method as set forth in claim 1, wherein the acquiring of k space samples in at least the outermost surrounding region using a row by row acquisition ordering includes:
    acquiring the k space samples using a serpentine row by row acquisition ordering.

14. The method as set forth in claim 1, wherein the acquiring of k space samples in at least the outermost surrounding region using a row by row acquisition ordering includes:
    applying secondary coordinate magnetic field gradients to traverse each row of k space samples; and
    switching to each new row of k space samples by applying a primary coordinate magnetic field gradient, the primary coordinate being generally transverse to the secondary coordinate.

15. The method as set forth in claim 1, wherein the acquiring of k space samples in at least the outermost surrounding region using a row by row acquisition ordering includes:
    (i) acquiring a first row of k space samples by traversing secondary coordinate positions in a positive direction at a first primary coordinate position;
    (ii) applying a primary coordinate magnetic field gradient to move to a second primary coordinate position;
    (iii) acquiring the second row of k space samples by traversing secondary coordinate positions in a negative direction at the second primary coordinate position; and
    (iv) repeating (i), (ii), and (iii) to acquire a plurality of rows of k space samples indexed by the primary coordinate.

16. The method as set forth in claim 15, wherein the primary coordinate is a slice coordinate, the secondary coordinate is a phase encode coordinate orthogonal to the slice coordinate, and each k space sample is a readout line along a third coordinate orthogonal to both the slice and phase encode coordinates.

17. The method as set forth in claim 1, wherein the acquiring of k space samples in at least the outermost surrounding region using a row by row acquisition ordering includes:
    (i) acquiring a first contiguous portion k space samples along a row within the outermost annular surrounding region;
    (ii) skipping at least samples along the row contained in the central region;
    (iii) acquiring a second contiguous portion k space samples along the row within the outermost annular surrounding region, the second contiguous portion k space samples along the row being separated from the first contiguous portion k space samples along the row by at least the central region; and
    repeating (i), (ii), and (iii) for each row of the row by row acquisition.

18. A magnetic resonance imaging method comprising:
dividing k-space into a central region including k-space center and one or more annular surrounding regions having increasing distances from k-space center, the one or more annular surrounding regions including an outermost surrounding region having a largest distance from k-space center;
acquiring k-space samples in the central region;
subsequent to the acquiring of k-space samples in the central region, acquiring k-space samples in the one or more annular surrounding regions, the k-space samples in the outermost surrounding region being acquired last using a plane-by-plane acquisition ordering in which all k-space samples in the outermost surrounding region belonging to a current k-space plane are acquired to complete the current k-space plane before samples in the outermost surrounding region belonging to other k-space planes are acquired; and
reconstructing each completed current k-space plane into a reconstructed image plane without waiting for other k-space planes to be completed
wherein each of the above steps is performed on a magnetic resonance imaging scanner.

19. The method as set forth in claim 18, wherein the k-space samples are readout lines of k space.

20. A magnetic resonance imaging apparatus comprising:
a magnetic resonance imaging scanner configured for imaging an associated imaging subject;
a magnetic resonance imaging controller configured for:
(i) dividing k space into a central region disposed at k space center and one or more annular surrounding regions having increasing distances from k space center and including an outermost surrounding region of largest distance from k space center,
(ii) determining an optimum time for imaging a magnetic contrast agent bolus,
(iii) acquiring k space samples in the central region at about the optimum time, and
(iv) after acquiring the k space samples in the central region, acquiring k space samples in the one or more annular surrounding regions the acquiring in at least the outermost surrounding region using a plane by plane data acquisition ordering in which all k space samples in the outermost surrounding region belonging to a current k space plane are acquired to complete the current k space plane before samples in the outermost surrounding region belonging to other k space planes are acquired; and
a reconstruction processor that reconstructs the completed current k space plane into a reconstructed plane image without waiting for other k space planes to be completed.

21. The magnetic resonance imaging apparatus as set forth in claim 20, wherein the acquiring of k space samples in the central region includes:
acquiring k space samples in the central region using an ordering other than a plane by plane ordering.

22. The magnetic resonance imaging apparatus as set forth in claim 20, wherein the acquiring of k space samples in the central region includes:
acquiring k space samples in the central region using a random or pseudorandom ordering.

23. The magnetic resonance imaging apparatus as set forth in claim 22, further comprising:
a display device that displays each reconstructed plane image once the reconstruction processor completes reconstruction of the corresponding k space plane, without waiting for the reconstruction processor to reconstruct other k space planes.

24. A magnetic resonance imaging apparatus comprising:
means for dividing k space into a central region disposed at k space center and one or more annular surrounding regions having increasing distances from k space center, the one or more annular surrounding regions including an outermost surrounding region having a largest distance from k space center;
means for acquiring k space samples in the k space, the k space samples in the central region being acquired first, the k space samples in the outermost surrounding region being acquired last, the k space samples in at least the outermost surrounding region being acquired using a row by row data acquisition ordering in which each row of k space samples acquired in the outermost surrounding region completes a k space plane; and
means for reconstructing each completed k space plane into a reconstructed image plane without waiting for all k space samples in the outermost surrounding region to be acquired.

25. The apparatus as set forth in claim 24, wherein the acquiring means includes:
(i) means for acquiring a row of k space samples by traversing secondary coordinate (cs) positions in a positive direction at a first primary coordinate position (cp);
(ii) means for applying a primary coordinate (cp) magnetic field gradient to move to a second primary coordinate (cp) position;
(iii) means for acquiring the second row of k space samples by traversing secondary coordinate (cs) positions in a negative direction at the second primary coordinate (cp) position; and
(iv) means for repeatedly invoking the means (i), (ii), and (iii) to acquire a plurality of rows of k space samples indexed by the primary coordinate (cp).

26. The apparatus as set forth in claim 24, wherein the acquiring means acquires at least the central region using other than a row by row acquisition ordering, and the reconstructing means includes:
means for sorting k space samples acquired in other than a row by row acquisition ordering into a row by row ordering.

27. The apparatus as set forth in claim 24, wherein the reconstructing means includes:
means for organizing k space samples of the completed k space plane from the central region and from the one or more annular surrounding regions into a k space plane data set organized row by row;
means for Fourier transforming each k space sample of the completed k space plane in a first direction to recover spatial content in the first direction; and
means for Fourier transforming the k space plane data set organized row by row in a second direction transverse to the first direction to recover spatial content in the second direction.

* * * * *